(12) United States Patent
Matsumaru (10) Patent No.: US 10,007,137 B2
(45) Date of Patent: Jun. 26, 2018

(54) OPTICAL DEVICE PACKAGE

(71) Applicant: FUJIKURA LTD., Tokyo (JP)

(72) Inventor: Kohei Matsumaru, Sakura (JP)

(73) Assignee: FUJIKURA LTD., Tokyo (JP)

( * ) Notice: Subject to any disclaimer, the term of this patent is extended or adjusted under 35 U.S.C. 154(b) by 0 days. days.

(21) Appl. No.: 15/501,258

(22) PCT Filed: Mar. 23, 2016

(86) PCT No.: PCT/JP2016/059242
§ 371 (c)(1),
(2) Date: Feb. 2, 2017

(87) PCT Pub. No.: WO2016/167093
PCT Pub. Date: Oct. 20, 2016

(65) Prior Publication Data
US 2017/0219871 A1   Aug. 3, 2017

(30) Foreign Application Priority Data
Apr. 17, 2015  (JP) ................... 2015-085405

(51) Int. Cl.
*G02F 1/1333* (2006.01)
*H01L 27/146* (2006.01)
*H01L 31/024* (2014.01)

(52) U.S. Cl.
CPC .. *G02F 1/133308* (2013.01); *G02F 1/133382* (2013.01); *H01L 27/14618* (2013.01); *H01L 27/14625* (2013.01); *H01L 31/024* (2013.01); *G02F 2001/13332* (2013.01); *G02F 2001/133311* (2013.01); *G02F 2001/133331* (2013.01)

(58) Field of Classification Search
CPC ..................... G02F 1/133308; H01L 27/14618
USPC .......................................................... 257/432
See application file for complete search history.

(56) References Cited

U.S. PATENT DOCUMENTS

| | | | |
|---|---|---|---|
| 6,683,298 B1 * | 1/2004 | Hunter | G02B 7/022 250/208.1 |
| 2006/0082859 A1 * | 4/2006 | Huibers | G02B 26/0833 359/291 |

FOREIGN PATENT DOCUMENTS

| JP | 9-148469 A | 6/1997 |
|---|---|---|
| JP | 10-214031 A | 8/1998 |
| JP | 2004-53964 A | 2/2004 |
| JP | 2013-101218 A | 5/2013 |

OTHER PUBLICATIONS

International Search Report dated Jun. 7, 2016, issued in counterpart International Application No. PCT/JP2016/059242 (1 page).
Written Opinion dated Jun. 7, 2016, issued in counterpart International Application No. PCT/JP2016/059242 (4 pages).

* cited by examiner

*Primary Examiner* — Moazzam Hossain
*Assistant Examiner* — Warren H Kilpatrick
(74) *Attorney, Agent, or Firm* — Westerman, Hattori, Daniels & Adrian, LLP (57) ABSTRACT

The present invention prevents an optical device from malfunctioning or receiving a reduced amount of light due to a foreign object adhering to or floating above a light receiving portion of the optical device. A metal frame (31) includes at least one protruding section (34) that protrudes toward an LCOS element (11).

11 Claims, 7 Drawing Sheets

OPTICAL DEVICE PACKAGE

TECHNICAL FIELD

The present invention relates to an optical device package in which an optical device is hermetically sealed. In particular, the present invention relates to an optical device package with a cover including (i) an optically nontransparent section which is made of an optically nontransparent material and which has an opening and (ii) an optical window section which is made from an optically transparent material and which covers the opening.

BACKGROUND ART

An optical device package in which an optical device is hermetically sealed is conventionally known as a technique for suppressing the effect of, for example, humidity. Particularly known is an optical device package with a cover including (i) an optically nontransparent section which is made of an optically nontransparent material and which has an opening and (ii) an optical window section which is made from an optically transparent material and which covers the opening (see Patent Literature 1).

Figure 10:
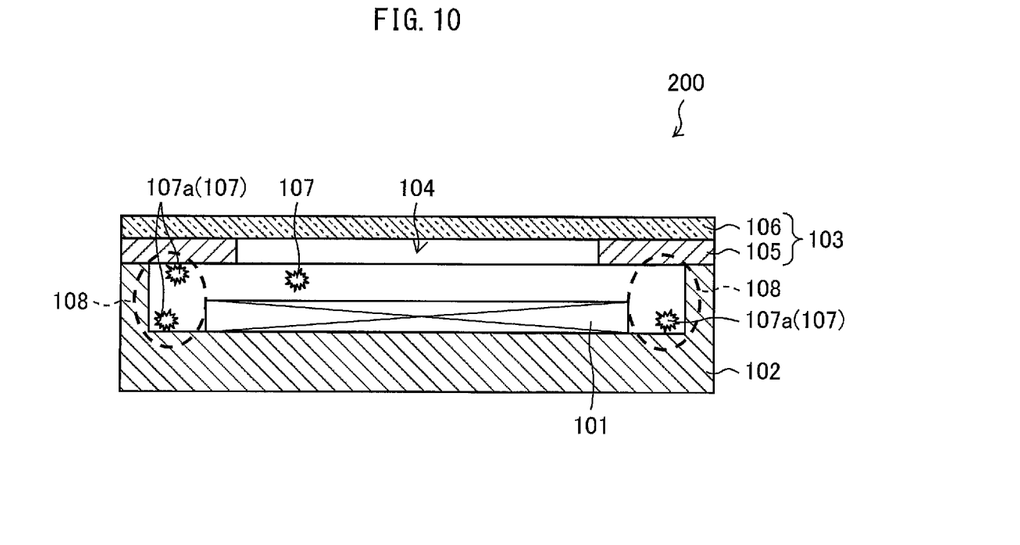
FIG. 10 is a cross-sectional view schematically illustrating an optical device package in accordance with conventional techniques.

FIG. 10 is a cross-sectional view schematically illustrating an optical device package 200 in accordance with conventional techniques. The optical device package 200 illustrated in FIG. 10 includes an optical device 101, a housing 102 which contains the optical device 101, and a cover 103 which is conformed to the housing 102. The cover 103 includes (i) a metal frame (optically nontransparent section) 105 having an opening 104 and (ii) an optical window section 106 covering the opening 104. The optical window section 106 can be realized by, for example, (i) mere glass or (ii) glass having an optically nontransparent material, such as a metal layer, provided on edges of and in the vicinity of the edges of the glass.

In the optical device package 200, the optical device 101 is contained in the housing 102 while the housing 102 is being filled with an inert gas (not shown), and is then hermetically sealed by the cover 103 and the housing 102.

CITATION LIST

Patent Literature

[Patent Literature 1]
Japanese Patent Application Publication Tokukaihei No. 9-148469 (Publication date: Jun. 6, 1997)

SUMMARY OF INVENTION

Technical Problem

With the configuration of the optical device package 200 illustrated in FIG. 10, there is a risk that a foreign object 107 will get into the housing 102 before the housing 102 is covered with the cover 103.

Methods, such as manufacturing the optical device package 200 in a clean room, have been conventionally employed to prevent such a foreign object 107 from getting into the housing 102. Even with such methods, however, it is difficult to completely prevent a foreign object 107 from getting into the housing 102.

Another possible method is to inspect the inside of the housing 102 immediately prior to its covering and then to detect and remove any foreign object 107 that has gotten into the housing 102. With such a method, however, an area such as an area 108 behind the metal frame 105 is likely to be a blind spot during inspection, and it is therefore difficult to detect and remove foreign objects 107 in the blind spot (i.e., foreign objects 107a).

As a result, the optical device package 200 illustrated in FIG. 10 will entail a risk that a foreign object 107 that has gotten into the housing 102 will adhere to or float above a light receiving portion of the optical device 101, which light receiving portion is provided on an upper surface of the optical device 101. Cross talk is caused by the foreign object 107 refracting light in a case where the optical device 101 is an optical switching device. This creates a problem that a malfunction will occur in the optical device 101 of the optical device package 200. In a case where the optical device 101 is a solid-state image sensor, the foreign object 107 reflects or refracts light. This causes a problem that an amount of received light will be markedly reduced.

The present invention has been made in view of the above problems, and an object of the present invention lies in providing an optical device package which prevents an optical device from malfunctioning or receiving a reduced amount of light due to a foreign object adhering to or floating above a light receiving portion of the optical device.

Solution to Problem

In order to solve to above problems, an optical device package in accordance with an embodiment of the present invention includes: an optical device; a housing in which the optical device is to be contained; and a cover including (i) an optically nontransparent section, having an opening, which is made from an optically nontransparent material and (ii) an optical window section configured to cover the opening, the optical window section being made from an optically transparent material, the optically nontransparent section having at least one protruding section which protrudes toward the optical device.

With the above configuration, in a case where a foreign object has gotten into the housing and remains beside the optical device, the at least one protruding section prevents the foreign object from moving toward a light receiving portion of the optical device, which light receiving portion is provided on an upper surface of the optical device. This prevents the foreign object from adhering to or floating above the light receiving portion of the optical device and therefore makes it possible to prevent the optical device from consequently malfunctioning or receiving a reduced amount of light.

Advantageous Effects of Invention

An embodiment of the present invention makes it possible to prevent an optical device from malfunctioning or receiving a reduced amount of light due to a foreign object adhering to or floating above a light receiving portion of the optical device.

BRIEF DESCRIPTION OF DRAWINGS

(a) through (d) of FIG. 3 are each a cross-sectional view illustrating an optical device package in accordance with a first variation of Embodiment 1 of the present invention.

(a) and (b) of FIG. 4 are each a plan view illustrating a surface of an optically nontransparent section, which surface faces an optical device, in accordance with a second variation of Embodiment 1 of the present invention.

(a) through (c) of FIG. 7 are each a cross-sectional view illustrating an optical device package in accordance with a variation of Embodiment 2 of the present invention.

DESCRIPTION OF EMBODIMENTS

The following description will discuss embodiments of the present invention. Note that the following description will discuss an optical device package, in accordance with each embodiment, in which a liquid crystal on silicon (LCOS) element is hermetically sealed. As such, each optical device package is hereinafter referred to as an "LCOS package." Note also that any member having a function identical to that of a previously described member will be assigned an identical reference number, and a description thereof will be omitted.

Embodiment 1

Figure 1:
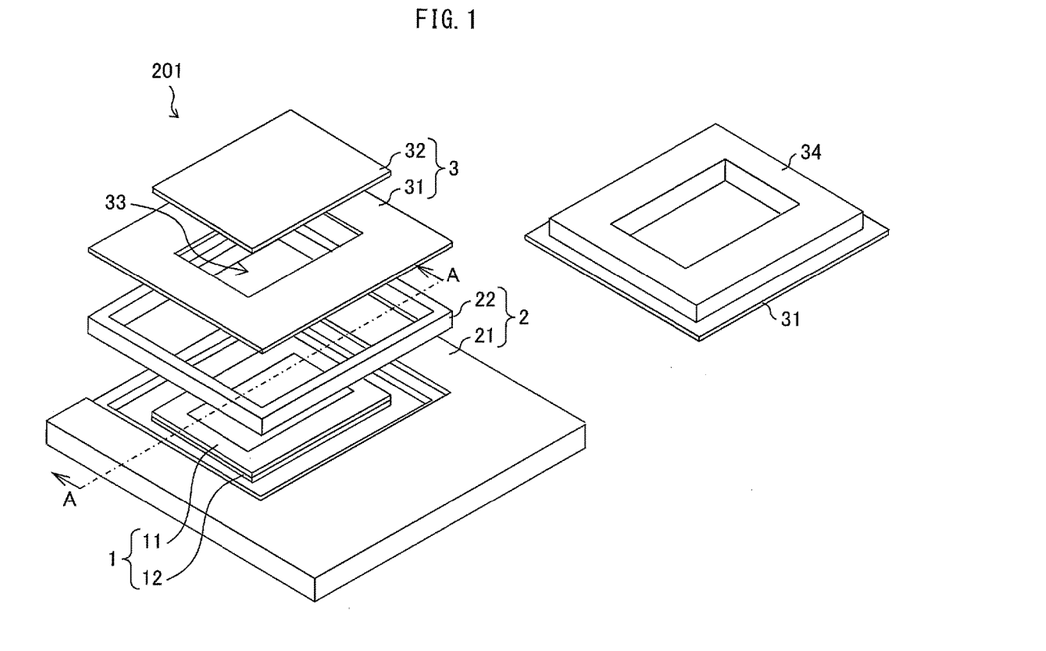
FIG. 1 consists of (i) an exploded perspective view illustrating an optical device package in accordance with Embodiment 1 of the present invention and (ii) a perspective view illustrating a surface of an optically nontransparent section of the optical device package which surface faces an optical device.
Figure 2:
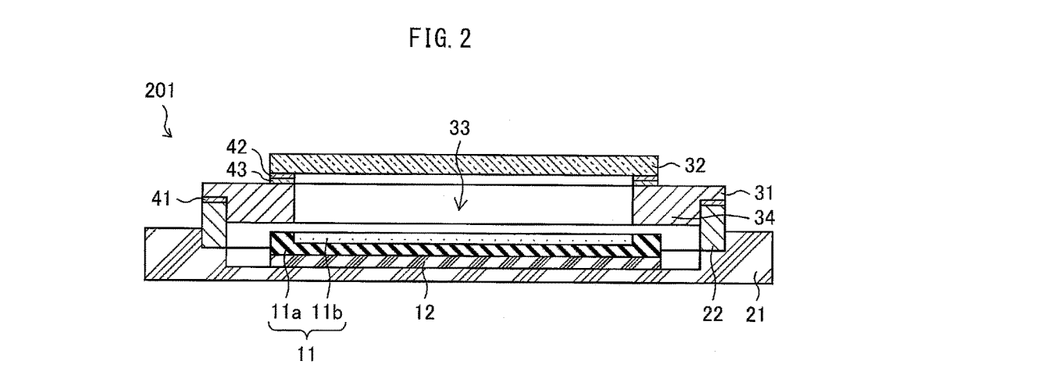
FIG. 2 is a cross-sectional view of the optical device package taken along line A-A of FIG. 1.

FIG. 1 is an exploded perspective view illustrating a liquid crystal on silicon (LCOS) package 201 in accordance with Embodiment 1 of the present invention. FIG. 2 is a cross-sectional view of the LCOS package 201 taken along line A-A of FIG. 1. Note that FIG. 1 also illustrates a perspective view obtained when a cover 3 of the LCOS package 201 is viewed from a rear surface side of the cover 3.

The LCOS package (optical device package) 201 illustrated in FIGS. 1 and 2 includes an optical device unit 1, a housing 2, and a cover 3.

The optical device unit 1 includes an LCOS element (optical device) 11 and a heater 12. The LCOS element 11 includes a silicon substrate section 11a and a liquid crystal section 11b. The silicon substrate section 11a is obtained by forming, on a silicon substrate, a driving circuit for driving the LCOS element 11. The liquid crystal section 11b serves as a light receiving part of the LCOS element 11 provided on an upper surface of the LCOS element 11. The liquid crystal section 11b includes liquid crystals, a transparent electrode, an alignment film, and the like. It is necessary to carefully manage the temperature of the LCOS element 11, and the heater 12 serves to control this temperature. Note that the heater 12 can be omitted in a case where a solid-state image sensor is employed in place of the LCOS element 11.

The housing 2 contains the LCOS element 11, and includes a ceramic substrate 21 and a sealing frame 22. The sealing frame 22 is provided on the ceramic substrate 21 so as to surround the LCOS element 11, and is made of, for example, optically nontransparent ceramic or a metal.

The cover 3 is provided above the LCOS element 11, and is conformed to the housing 2. The cover 3 includes a metal frame (optically nontransparent section) 31 and a glass substrate (optical window section) 32.

The metal frame 31 is made from a nontransparent metal material, and includes an opening 33 located above the LCOS element 11. The glass substrate 32 covers the opening 33. This allows light from outside the LCOS package 201 to pass through the glass substrate 32 and reach the liquid crystal section 11b of the LCOS element 11.

The sealing frame 22 and the metal frame 31 are joined by a joining layer 41 made from solder or a brazing filler metal. A metal coating provided on edges and in the vicinity of the edges of a surface of the glass substrate 32, which surface faces the LCOS element 11, serves as a metal coating layer 42. The metal frame 31 and the metal coating layer 42 are joined by a joining layer 43 made from solder.

The metal frame 31 includes a protruding section 34 formed thereon. The protruding section 34 protrudes from a surface of the metal frame 31, which surface faces the LCOS element 11, toward the LCOS element 11.

The protruding section 34 makes it possible to reduce a distance between the silicon substrate section 11a and the metal frame 31. This makes it possible to prevent a foreign object, which has gotten into the housing 2 and which remains beside the LCOS element 11, from moving toward the liquid crystal section 11b (light receiving portion) provided on the upper surface of the LCOS element 11. This prevents a foreign object from adhering to or floating above the liquid crystal section 11b of the LCOS element 11, and therefore ultimately makes it possible to prevent consequent malfunctioning of the LCOS element 11.

Note that a distance is maintained between the protruding section 34 and the LCOS element 11. This makes it possible to prevent the protruding section 34 from, for example, coming into contact with and putting pressure on the LCOS element 11 and, consequently, from damaging the LCOS element 11 or causing it to malfunction.

In general, in an optical device having a pixel structure (the LCOS element 11 being an example thereof), a foreign object whose size is greater than or equal to the surface area of one (1) pixel of the optical device is likely to directly cause the optical device to malfunction or receive a reduced amount of light.

In the case of such an optical device having such a pixel structure, the protruding section 34 is preferably separated from the device by a distance of less than the size of a pixel in the optical device. For example, in the case of an optical device whose pixels are squares each measuring 10 μm per side, a foreign object having a size of 10 μm×10 μm or greater can cause the aforementioned problems. As such, the distance of separation is preferably less than 10 μm.

This makes it possible to effectively prevent a foreign object, which could directly cause the optical device having a pixel structure to malfunction or receive a reduced amount of light, from moving toward the light receiving portion of the optical device.

(First Variation of Embodiment 1)

Figure 3:
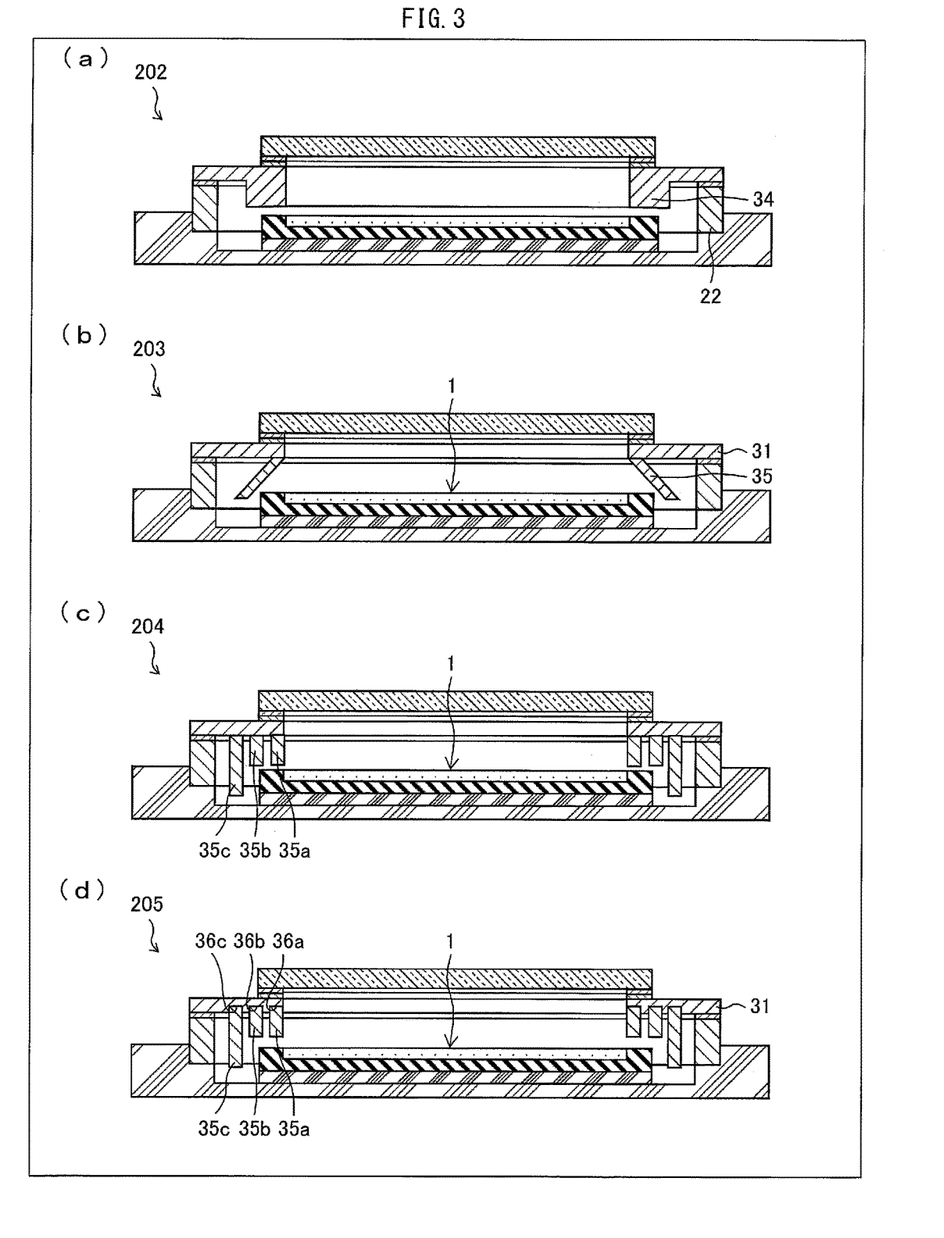

(a) through (d) of FIG. 3 are cross-sectional views illustrating respective LCOS packages 202 through 205 in accordance with a first variation of the LCOS package 201.

The LCOS package 202 illustrated in (a) of FIG. 3 differs from the LCOS package 201 in that a distance is maintained between a protruding section 34 and a sealing frame (a side wall of a housing) 22. The LCOS package 202 is otherwise configurationally identical to the LCOS package 201.

Since a distance is maintained between the protruding section 34 and the sealing frame 22, it is possible to secure a margin between the protruding section 34 and the sealing frame 22 to allow for manufacturing tolerances of the protruding section 34. It is also possible to trap a foreign object between the protruding section 34 and the sealing frame 22.

The LCOS package 203 illustrated in (b) of FIG. 3 differs from the LCOS package 201 with regards to points described below. The LCOS package 203 is otherwise configurationally identical to the LCOS package 201.

The LCOS package 203 includes a protruding section 35 instead of the protruding section 34. The protruding section 35 has a function similar to that of the protruding section 34 but is provided as a member that is provided separately from a metal frame 31. The protruding section 35 can be made of any low-outgassing material that is generally suited for use in a hermetically sealed package, and examples thereof encompass a metal, epoxy resin, and acrylic resin. This enables reduced manufacturing costs and a greater degree of freedom with regards to the shape of the protruding section, in comparison with a metal frame 31 on which the protruding section 34 is integrally formed.

Furthermore, in the LCOS package 203, the protruding section 35 extends from an area directly above an LCOS element 11 to an area lateral to the LCOS element 11. This causes an increase in a distance which a foreign object travels from (i) the area lateral to the edges of the LCOS element 11 to (ii) an area above liquid crystal section 11b. As such, it is possible to effectively prevent a foreign object, which could directly cause the LCOS element 11 to malfunction, from moving toward the liquid crystal section 11b.

Figure 8:
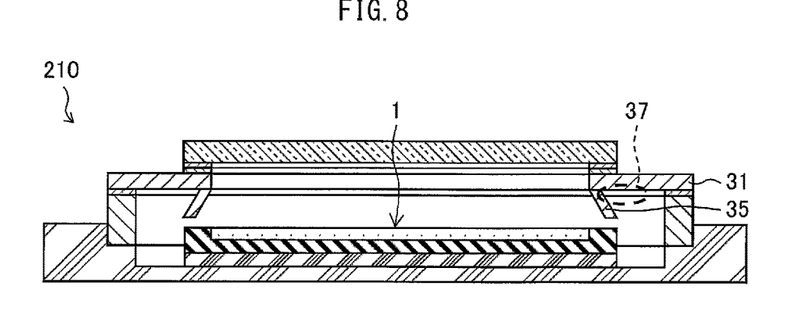
FIG. 8 is a cross-sectional view illustrating another example configuration in which a protruding section extends toward a side wall of a housing.
Figure 9:
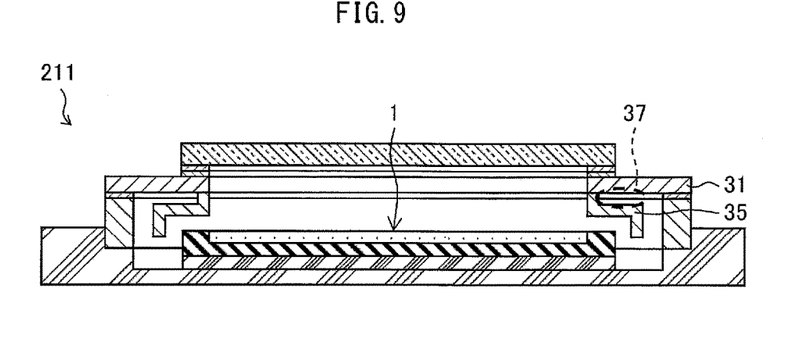
FIG. 9 is a cross-sectional view illustrating yet another example configuration in which a protruding section extends toward a side wall of a housing.

Part or all of the protruding section 35 extends so as to be increasingly closer to a sealing frame 22 toward an end of the protruding section 35. This makes it possible to trap a foreign object on a sealing frame 22 side of the protruding section 35. Similar configurations to the example of (b) of FIG. 3 can also be realized as in the examples of respective FIGS. 8 and 9. FIG. 8 illustrates an LCOS package 210 in which a protruding section 35 is shorter than that of the LCOS package 203 (i.e., an end of the protruding section 35 is located directly above an LCOS element 11). FIG. 9 illustrates an LCOS package 211 in which, in contrast to the LCOS package 203, a protruding section 35 is provided to have a stepped shape. The LCOS packages 210 and 211 each have a space 37 which allows a foreign object to be trapped.

The LCOS package 204 illustrated in (c) of FIG. 3 differs from the LCOS package 203 with regards to points described below. The LCOS package 204 is otherwise configurationally identical to the LCOS package 203.

The LCOS package 204 includes a plurality of protruding sections 35. Out of the plurality of protruding sections 35, a protruding section 35a, which is provided most toward an LCOS element 11 side, extends toward an upper surface of the LCOS element 11. Out of the plurality of protruding sections 35, a protruding section 35c, which is provided farthest from the LCOS element 11, extends toward an area lateral to the LCOS element 11. Out of the protruding sections 35, a protruding section 35b, which is provided between the protruding section 35a and the protruding section 35c, extends toward (i) the upper surface of the LCOS element 11 and (ii) the area lateral to the LCOS element 11.

Provision of a plurality of protruding sections 35 makes it possible to more reliably prevent a foreign object from adhering to or floating above a liquid crystal section 11b of the LCOS element 11. That is, although it is difficult to perfectly control how a foreign object will move, the provision of such a plurality of protruding sections 35 makes it possible to trap and stop a foreign object between two of the plurality of protruding sections 35. This ultimately makes it possible to prevent a foreign object from moving so far as to be above the liquid crystal section 11b.

The LCOS package 205 illustrated in (d) of FIG. 3 differs from the LCOS package 204 with regards to points described below. The LCOS package 205 is otherwise configurationally identical to the LCOS package 204.

The LCOS package 205 includes a metal frame 31 having grooves 36a through 36c which respectively correspond to protruding sections 35a through 35c. The protruding sections 35a through 35c are fitted into grooves 36a through 36c, respectively.

With the configuration in which the protruding sections 35a through 35c are fitted into the grooves 36a through 36c, respectively, it is possible to adjust the heights of the respective protruding sections 35a through 35c in accordance with depths by which the protruding sections 35a through 35c are fitted into the grooves 36a through 36c, respectively. This makes it possible to secure a margin between the respective protruding sections 35a through 35c and the LCOS element 11 to allow for manufacturing tolerances of the respective protruding sections 35a through 35c.

(Second Variation of Embodiment 1)

Figure 4:
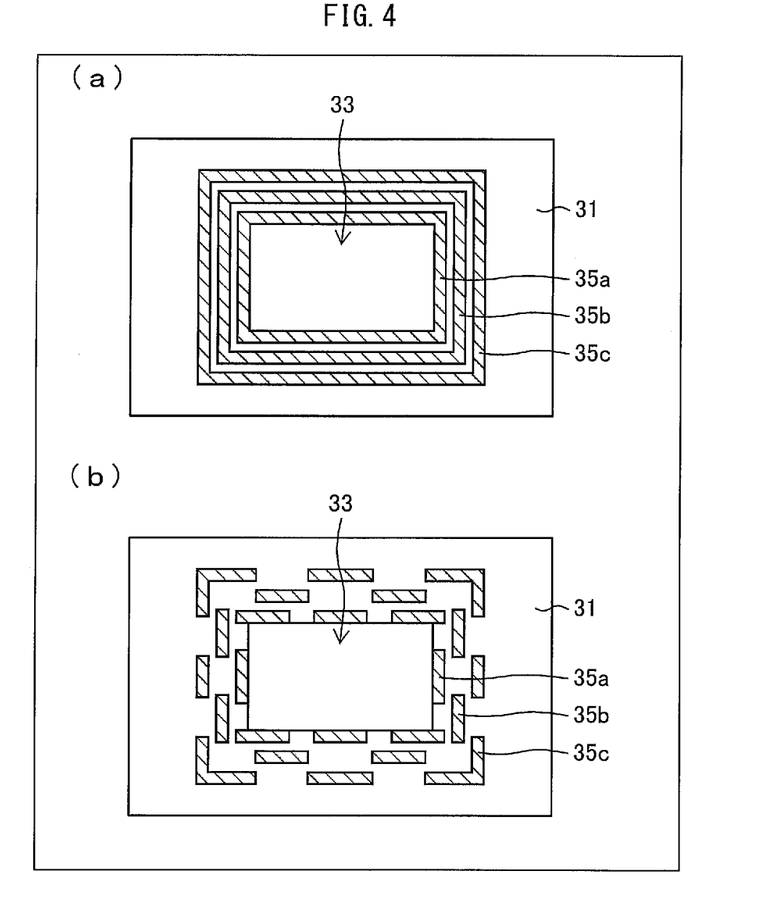

(a) and (b) of FIG. 4 are each a plan view illustrating a surface of a metal frame 31, which surface faces an LCOS element 11, in accordance with a second variation of Embodiment 1. The following description will merely discuss a combination of the metal frame 31 and protruding sections 35 but also applies to a combination of the metal frame 31 and a protruding section 34.

As is illustrated in each of (a) and (b) of FIG. 4, there are provided, on the metal frame 31, protruding sections 35a through 35c (see (c) and (d) of FIG. 3).

The metal frame 31 illustrated in (a) of FIG. 4 is configured so that each of the protruding sections 35a through 35c surrounds an opening 33 in a metal frame 31 and has a continuous, frame-like shape. This prevents, along the entire perimeter of the LCOS element 11, a foreign object from moving toward a liquid crystal section 11b. Meanwhile, the metal frame 31 illustrated in (b) of FIG. 4 is configured so that each of the protruding sections 35a through 35c surrounds the opening 33 in the metal frame 31 and has a frame-like but non-continuous shape. The metal frame 31 illustrated in (b) of FIG. 4 makes it possible to prevent stress occurring in the metal frame 31 in a case where the protruding sections 35a through 35c and the metal frame 31 are made from different materials.

(Additional Remarks)

Embodiment 1 discusses an optical device package (LCOS package) containing an LCOS element, but is not limited to such, provided that an optical device to be contained in the optical device package is an optical device which receives or outputs light. Examples of such an optical device encompass a micro electro mechanical system (MEMS) mirror and a solid-state image sensor. In the case of such a solid-state image sensor the configuration of the optical device package in accordance with Embodiment 1 brings about an effect of preventing a reduction in amount of light received by the optical device, instead of the effect of preventing the optical device from malfunctioning.

As has been described, the metal coating layer 42 is provided on the glass substrate 32, but the metal coating layer 42 can be omitted. Put conversely, provided that the optical window section is mere glass (optically transparent material), an optically nontransparent material such as a metal layer can be provided on edges of and in the vicinity of the edges of the glass.

Note also that a smaller distance between the LCOS element 11 and the protruding section 34 increases the effect of preventing a foreign object from moving but also increases the risk of the protruding section 34 coming into contact with and/or putting pressure on the LCOS element 11. In cases where it is desirable to reduce, as much as possible, the risk of the protruding section 34 coming into contact with or putting pressure on the LCOS element 11, the above effect can be expected to a certain degree even when the distance between the LCOS element 11 and the protruding section 34 is approximately 100 µm. The same applies to the protruding section(s) 35.

In order to simplify the description of LCOS packages 201 through 205, modes including the protruding section 34 were clearly distinguished from modes including the protruding section(s) 35. In actuality, however, both of these modes can be applied to any of the LCOS packages 201 through 205.

Embodiment 2

Figure 5:
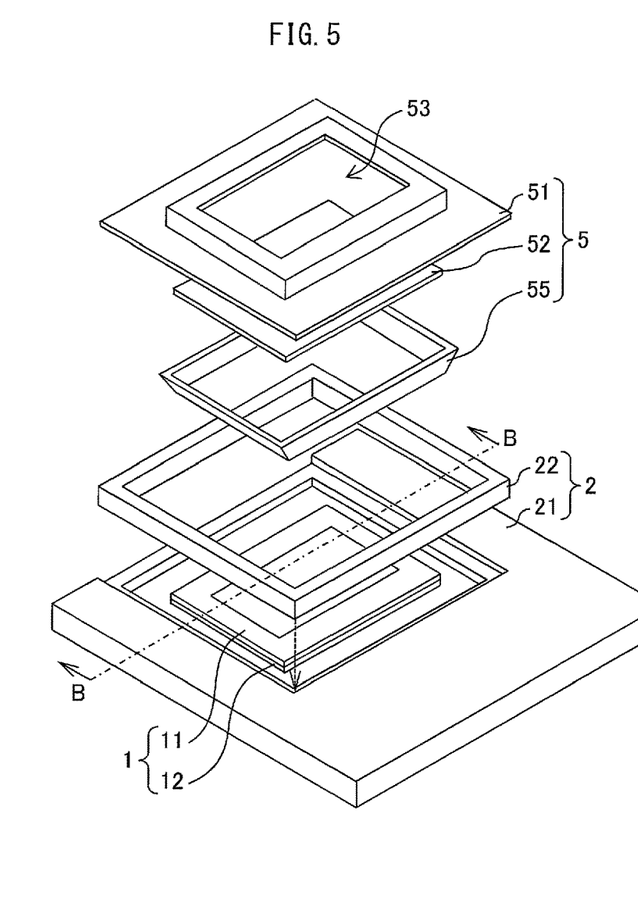
FIG. 5 is an exploded perspective view illustrating an optical device package in accordance with Embodiment 2 of the present invention.
Figure 6:
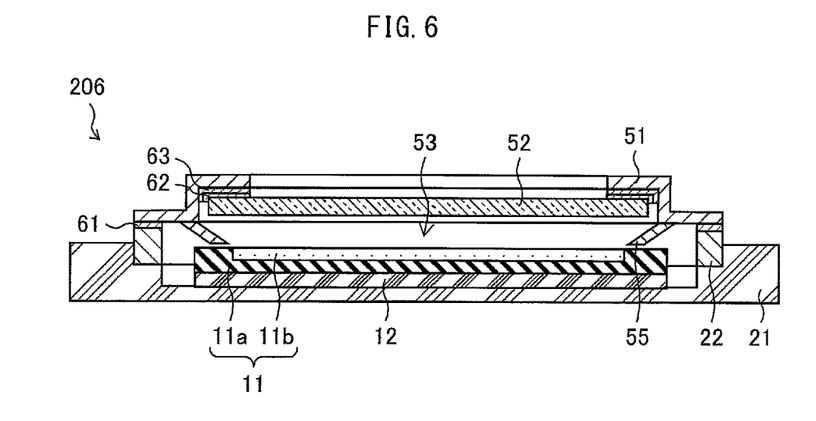
FIG. 6 is a cross-sectional view of the optical device package taken along line B-B of FIG. 5.

FIG. 5 is an exploded perspective view illustrating an LCOS package 206 in accordance with Embodiment 2 of the present invention. FIG. 6 is a cross-sectional view of the LCOS package 206 taken along line B-B of FIG. 5.

The LCOS package 206 illustrated in FIGS. 5 and 6 differs from the LCOS package 201 in that the LCOS package 206 includes a cover 5 instead of the cover 3. The LCOS package 206 is otherwise configurationally identical to the LCOS package 201.

The cover 5 is provided above an LCOS element 11 and is conformed to a housing 2. The cover 5 is composed of a metal frame (optically nontransparent section) 51, a glass substrate (optical window section) 52, and a protruding section (optically nontransparent section) 55.

The metal frame 51 is made from a nontransparent metal material and has an opening 53 located above the LCOS element 11. The glass substrate 52 covers the opening 53. This causes light from outside the LCOS package 206 to pass through the glass substrate 52 and then reach a liquid crystal section 11b of the LCOS element 11.

A sealing frame 22 and the metal frame 51 are joined by a joining layer 61 made from solder or a brazing filler metal. A metal coating provided on edges of and in the vicinity of the edges of a surface of the glass substrate 52, which surface faces away from the LCOS element 11, serves as a metal coating layer 62. The metal frame 51 and the metal coating layer 62 are joined by a joining layer 63 made from solder.

The metal frame 51 and the glass substrate 52 are made from the same materials as the metal frame 31 and the glass substrate 32, respectively.

In the metal frame 51, the protruding section 55 is provided as a member that is provided separately from the metal frame 51. The protruding section 55 protrudes toward the LCOS element 11 from a surface of the metal frame 51 which surface faces the LCOS element 11. The protruding section 55 brings about an effect of preventing a foreign object from moving, similarly to the protruding sections 34 and 35.

The glass substrate 52 of the LCOS package 206 is joined to a surface of the metal frame 51, which surface faces the LCOS element 11 (i.e., which surface is on an LCOS element 11 side). This prevents edges of the glass substrate 52 from being exposed to the outside of the LCOS package 206 and therefore reduces damage, to the glass substrate 52, caused by factors outside the LCOS package 206.

(Variation of Embodiment 2)

Figure 7:
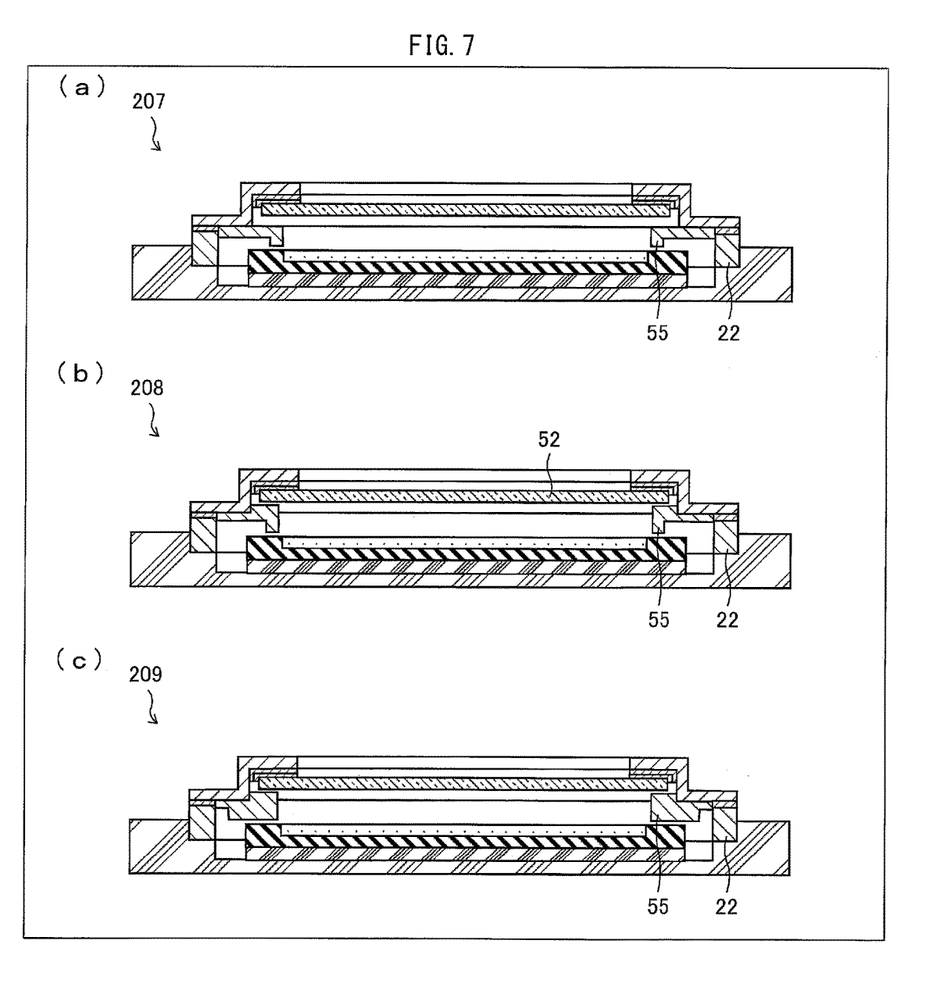

(a) through (c) of FIG. 7 are cross-sectional views illustrating LCOS packages 207 through 209, respectively, in accordance with a variation of the LCOS package 206.

The LCOS packages 207 through 209 illustrated in (a) through (c) of FIG. 7 differ from the LCOS package 206 with regards to points described below. The LCOS packages 207 through 209 are otherwise configurationally identical to the LCOS package 206.

The protruding section 55 of the LCOS package 206 illustrated in FIG. 6 is obliquely provided, as seen in the cross section of FIG. 6. In contrast, in each of the LCOS packages 207 through 209, a protruding section 55 is provided to have an L shape, as seen in the cross section of (a) through (c) of FIG. 7.

In the LCOS package 208 illustrated in (b) of FIG. 7, a distance between a glass substrate 52 and the protruding section 55 is less than that of the LCOS package 207 (a) illustrated in FIG. 7. In the LCOS package 209 illustrated in (c) of FIG. 7, a distance between a sealing frame 22 and an end of the protruding section 55 is less than that of the LCOS package 208 illustrated in (b) of FIG. 7.

[Recapitulation]

Embodiments of the present invention can be construed as in the descriptions below.

An optical device package in accordance with an embodiment of the present invention includes: an optical device; a housing in which the optical device is to be contained; and a cover including (i) an optically nontransparent section, having an opening, which is made from an optically nontransparent material and (ii) an optical window section configured to cover the opening, the optical window section being made from an optically transparent material, the optically nontransparent section having at least one protruding section which protrudes toward the optical device.

With the above configuration, in a case where a foreign object has gotten into the housing and remains beside the optical device, the at least one protruding section prevents the foreign object from moving toward a light receiving portion of the optical device, which light receiving portion is provided on an upper surface of the optical device. This prevents the foreign object from adhering to or floating above the light receiving portion of the optical device and therefore makes it possible to prevent the optical device from consequently malfunctioning or receiving a reduced amount of light.

An optical device package in accordance with another embodiment of the present invention is configured such that a distance is maintained between the at least one protruding section and the optical device.

In the above configuration, a distance is maintained between the protruding section and the optical device. This prevents the protruding section from, for example, coming into contact with the optical device and putting pressure thereon. This therefore prevents the optical device from consequently being damaged, malfunctioning, or receiving a reduced amount of light.

In a case where the optical device has a pixel structure, a foreign object whose size is greater than or equal to the surface area of one (1) pixel of the optical device is likely to directly cause the optical device to malfunction or receive a reduced amount of light.

In such a case, the optical device package is configured such that the distance between the at least one protruding section and the optical device is less than a size of a pixel of the optical device.

The above configuration makes it possible to effectively prevent a foreign object, which could directly cause the optical device to malfunction or received a reduced amount of light, from moving toward the light receiving portion of the optical device.

An optical device package in accordance with another embodiment of the present invention is configured such that a distance is maintained between the at least one protruding section and a side wall of the housing.

With the above configuration, because a distance is maintained between the at least one protruding section and the side wall of the housing, it is possible to secure a margin between therebetween to allow for manufacturing tolerances of the at least one protruding section. The above configuration also makes it possible to trap a foreign object between the at least one protruding section and the side wall of the housing.

An optical device package in accordance with another embodiment of the present invention is configured such that at least part of the at least one protruding section extends so as to be increasingly close to the side wall of the housing toward an end of the at least one protruding section.

The above configuration makes it possible to trap a foreign object on a side of the at least one protruding section which side is toward the side wall of the housing.

An optical device package in accordance with another embodiment of the present invention is configured such that the at least one protruding section extends so as to reach an area lateral to the optical device.

An optical device package in accordance with another embodiment of the present invention is configured such that the at least one protruding section of the optically nontransparent section includes a plurality of protruding sections.

The above configuration makes it possible to more reliably prevent a foreign object from adhering to or floating above the light receiving portion of the optical device.

An optical device package in accordance with another embodiment of the present invention is configured such that the at least one protruding section is a member which is provided separately from the optically nontransparent section and which is provided to the optically nontransparent section.

The above configuration enables reduced manufacturing costs and a greater degree of freedom with regards to the shape of the at least one protruding section, in comparison with an optically nontransparent section which is integrally formed with a protruding section.

An optical device package in accordance with another embodiment of the present invention is configured such that the at least one protruding section is a member which is provided separately from the optically nontransparent section and which is fitted into a groove in the optically nontransparent section.

The above configuration makes it possible to adjust the height(s) of the at least one protruding section in accordance with the depth(s) by which the at least one protruding section is fitted into the corresponding groove in the optically nontransparent section. This makes it possible to secure a margin between the at least one protruding section and the optical device to allow for manufacturing tolerances of the at least one protruding section.

An optical device package in accordance with another embodiment of the present invention is configured such that the optical window section is joined to a surface of the optically nontransparent section which surface faces the optical device.

The above configuration prevents edges of the optical window section from being exposed to the outside of the optical device package and therefore reduces damage, to the optical window section, caused by factors outside the optical device package.

The present invention is not limited to the embodiments, but can be altered by a skilled person in the art within the scope of the claims. An embodiment derived from a proper combination of technical means each disclosed in a different embodiment is also encompassed in the technical scope of the present invention.

INDUSTRIAL APPLICABILITY

Embodiments of the present invention can be applied to an optical device package in which an optical device is hermetically sealed. In particular, embodiments of the present invention can be applied to an optical device package with a cover including (i) an optically nontransparent section which is made of an optically nontransparent material and which has an opening and (ii) an optical window section which is made from an optically transparent material and which covers the opening.

REFERENCE SIGNS LIST

1 Optical device unit
2 Housing
3 Cover
5 Cover
11 LCOS element (optical device)
22 Sealing frame (side wall of housing)
31 Metal frame (optically nontransparent section)
32 Glass substrate (optical window section)
33 Opening
34, 35 Protruding section (optically nontransparent section)
35a-35c Protruding section (optically nontransparent section)
51 Metal frame (optically nontransparent section)
52 Glass substrate (optical window section)
53 Opening
55 Protruding section (optically nontransparent section)
201-211 LCOS package (optical device package)

The invention claimed is:
1. An optical device package comprising:
an optical device;
a housing in which the optical device is to be contained; and
a cover including (i) an optically nontransparent section, having an opening, which is made from an optically nontransparent material and (ii) an optical window section configured to cover the opening, the optical window section being made from an optically transparent material,
the optically nontransparent section having at least one protruding section which protrudes toward the optical device, a first distance, which is maintained in a height direction of the optical device package, between the at least one protruding section and the optical device is smaller than a second distance, which is maintained in the height direction of the optical device package, between the optical window section and the optical device.

2. The optical device package as set forth in claim 1, wherein
the optical device has a pixel structure; and
the distance between the at least one protruding section and the optical device is less than a size of a pixel of the optical device.

3. The optical device package as set forth in claim 1, wherein a distance is maintained between the at least one protruding section and a side wall of the housing.

4. The optical device package as set forth in claim 3, wherein at least a part of the at least one protruding section extends so as to be increasingly close to the side wall of the housing toward an end of the at least one protruding section.

5. The optical device package as set forth in claim 1, wherein the at least one protruding section extends so as to reach an area lateral to the optical device.

6. The optical device package as set forth in claim 1, wherein the at least one protruding section of the optically nontransparent section includes a plurality of protruding sections.

7. The optical device package as set forth in claim 1, wherein the at least one protruding section is a member which is provided separately from the optically nontransparent section and which is provided to the optically nontransparent section.

8. The optical device package as set forth in claim 7, wherein the at least one protruding section is a member which is provided separately from the optically nontransparent section and which is fitted into a groove in the optically nontransparent section.

9. The optical device package as set forth in claim 1, wherein the optical window section is joined to a surface of the optically nontransparent section which surface faces the optical device.

10. The optical device package as set forth in claim 1, wherein the distance is maintained between the at least one protruding section and the optical device along the height direction of the optical device package such that the at least one protruding section does not contact the optical device.

11. The optical device package as set forth in claim 10, wherein the distance is maintained between the at least one protruding section and the optical device along the height direction of the optical device package such that the at least one protruding section does not contact a top surface of the optical device.

* * * * *